United States Patent
Zhang et al.

(10) Patent No.: US 7,733,169 B2
(45) Date of Patent: Jun. 8, 2010

(54) SLEW RATE AND SETTLING TIME IMPROVEMENT CIRCUITRY AND METHOD FOR 3-STAGE AMPLIFIER

(75) Inventors: Joy Y. Zhang, Tucson, AZ (US); Viola Schaffer, Erlangen (DE)

(73) Assignee: Texas Instruments Incorporated, Dallas, TX (US)

( * ) Notice: Subject to any disclaimer, the term of this patent is extended or adjusted under 35 U.S.C. 154(b) by 63 days.

(21) Appl. No.: 12/151,503

(22) Filed: May 7, 2008

(65) Prior Publication Data

US 2009/0278597 A1 Nov. 12, 2009

(51) Int. Cl.
*H03F 1/02* (2006.01)
(52) U.S. Cl. ........................... 330/9; 330/124 R
(58) Field of Classification Search .............. 330/9, 330/124 R
See application file for complete search history.

(56) References Cited

U.S. PATENT DOCUMENTS

| | | | |
|---|---|---|---|
| 6,933,781 B2 * | 8/2005 | Jaussi et al. | 330/253 |
| 7,292,095 B2 | 11/2007 | Burt et al. | 330/9 |
| 7,403,064 B2 * | 7/2008 | Chou et al. | 330/9 |
| 7,560,991 B2 * | 7/2009 | Lin et al. | 330/292 |

OTHER PUBLICATIONS

"A Micropower Chopper-Stabilized Operational Amplifier Using a SC Notch Filter With Synchronous Integration Inside the Continuous-Time Signal Path" by Rod Burt and Joy Zhang, IEEE Journal of Solid-State Circuits, vol. 41, No. 12, Dec. 2006, pp. 2729-2736.

* cited by examiner

*Primary Examiner*—Robert Pascal
*Assistant Examiner*—Khiem D Nguyen
(74) *Attorney, Agent, or Firm*—John J. Patti; Wade J. Brady, III; Frederick J. Telecky, Jr.

(57) ABSTRACT

An operational amplifier (1B) amplifies an input signal (Vin) to produce an output signal (Vout), and includes a 3-stage amplifier (1C) including a first amplifier stage (2) receiving the input signal, a second amplifier stage (3) driven by the first amplifier stage (2), and a third amplifier stage (4) driven by the second amplifier stage to produce the output signal. A slew detection current (Idetect) is generated when the input signal (Vin) exceeds a certain magnitude, and is converted to a control signal (41) that operates a switch (MN0) to short-circuit output conductors of the first amplifier stage to prevent signal charge from building up on capacitances associated with the output of the first amplifier stage during slewing. The three stage amplifier can be a chopper-stabilized, notch-filtered amplifier.

22 Claims, 5 Drawing Sheets

SLEW RATE AND SETTLING TIME IMPROVEMENT CIRCUITRY AND METHOD FOR 3-STAGE AMPLIFIER

BACKGROUND OF THE INVENTION

The present invention relates generally to slew rate and settling time improvement circuitry and methods for three-stage amplifiers, including chopper-stabilized three-stage amplifiers with notch filtering, chopper-stabilized three-stage amplifiers without notch filtering, and traditional three-stage amplifiers without chopper stabilization and notch filtering.

The closest prior art is believed to include the assignee's U.S. Pat. No. 7,292,095 Entitled "Notch Filter for Ripple Reduction in Chopper Stabilized Amplifiers" issued Nov. 6, 2007 to Rodney T. Burt and Joy Y. Zhang, and incorporated herein by reference. The closest prior art is believed to also include the article "A Micropower Chopper-Stabilized Operational Amplifier Using a SC Notch Filter with Synchronous Integration Inside the Continuous-Time Signal Path" by Rod Burt and present inventor Joy Zhang, IEEE Journal of Solid-State Circuits, volume 41, Number 12, December 2006, pages 2729-2736.

FIG. 1 shows a "traditional" basic three-stage amplifier 1A with multipath nested Miller compensation. This circuit configuration can be thought of as including a three-stage high gain signal path including three sequentially coupled stages 2, 3 and 4 having transconductances of gm1, gm2, and gm3, respectively, coupled in parallel with a wider bandwidth two stage signal path including two sequentially coupled stages 5 and 4 having transconductances of gm4 and gm3, respectively. The amount of DC precision of the operational amplifier shown in FIG. 1 is determined by the input stage 2 in the three-stage high gain signal path, while the high frequency response and phase margin are dominated by the two-stage signal path. Proper selection of the transconductances and the compensation capacitances results in the operational amplifier having the bandwidth and settling characteristics of a two-stage Miller compensated operational amplifier with a minimal increase in quiescent supply current Iq being required to achieve a good GBW/Iq (i.e., gain-bandwidth/Iq) ratio.

FIG. 2 shows the operational amplifier configuration of FIG. 1 further including basic chopper stabilization circuitry added before and after the input stage 2 in the high gain three-stage DC signal path. The chopper stabilization has the advantage of substantially reducing offset voltage, offset voltage drift with respect to temperature, and flicker noise, but has the disadvantage of shifting the offset voltage of the input stage 2 to the chopping frequency fs and thereby producing a ripple voltage component in the amplifier output Vout. The chopper-stabilized 3-stage amplifier of FIG. 2 provides excellent DC accuracy and low drift because any low frequency errors are essentially eliminated by the chopping switch. However, the drawback of a chopper-stabilized amplifier is that its output signal includes a ripple component due to the chopping switches. To overcome the output ripple, a switched capacitor notch filter is added after the chopping switch to filter out the ripple, as shown in FIG. 3.

FIG. 3 is a detailed schematic diagram of a three-stage chopper-stabilized amplifier including notch filtering for ripple reduction as described in the assignee's above-mentioned U.S. Pat. No. 7,292,095. In FIG. 3, chopper-stabilized amplifier 1C includes operational transconductance amplifier 2 having an input chopper 9 and an output chopper 10. Choppers 9 and 10 operate in response to clock signals Phase 1 and Phase 2, as shown. Switched capacitor notch filter 15 filters the chopped output of operational transconductance amplifier 2 synchronously with the chopping frequency of output chopper 10 to filter ripple voltage component of operational transconductance amplifier 2. Operational transconductance amplifier 3 amplifies the output of notch filter 15, which operates in response to clock signals Phase 3 and Phase 4. Vin, after being amplified by operational transconductance amplifier 2 and chopped by choppers 9 and 10, and is fed forward into the input of the second operational transconductance amplifier 3, the output of which is applied to the input of operational transconductance amplifier 4.

Notch filter 15 operates to average out the error at the output of the input transimpedance stage 2 during each ½ chopping clock cycle, then transfers the averaged signal to the next transimpedance stage 3. Although notch filter 15 works fairly well with the chopping technique (it reduces the output ripple to a level that is not even visible on an oscilloscope), its averaging function increases the settling time during a large signal slewing operation because notch filter 15 treats the fast changing, large-magnitude Vin signal as an error signal and averages it, as subsequently explained in detail with reference to FIG. 4. The result of the averaging process is that it takes several clock cycles for Vout to reach its final ideal value after a large-signal slewing. Therefore, the settling time of Vout is limited by the number of clock cycles needed to average the error signal to within a specified tolerance. (Even though the chopping clock frequency can be increased to reduce the settling time, a very high chopping frequency will cause many other problems due to parasitic capacitance in the circuitry and will increase the difficulty of implementing the amplifier of FIG. 3.)

There is an unmet need for a three-stage amplifier having fast output slewing rate and fast output settling time.

There also is an unmet need for a three-stage chopper-stabilized amplifier having fast output slewing rate and fast output settling time.

There also is an unmet need for a three-stage chopper-stabilized, notch-filtered amplifier having fast output slewing rate and fast output settling time.

There also is an unmet need for a chopper-stabilized amplifier having extremely low output ripple noise and also having fast output slewing rate and fast output settling time.

There also is an unmet need for a chopper-stabilized operational amplifier having extremely low output ripple noise, very low offset voltage, fast output slewing rate, and fast output settling time.

SUMMARY OF THE INVENTION

It is an object of the invention to provide a three-stage amplifier having fast output slewing rate and fast output settling time.

It is another object of the invention to provide a three-stage chopper-stabilized amplifier having fast output slewing rate and fast output settling time.

It is another object of the invention to provide a three-stage chopper-stabilized, notch-filtered amplifier having fast output slewing rate and fast output settling time.

It is another object of the invention to provide a chopper-stabilized amplifier having extremely low output ripple noise and also having fast output slewing rate and fast output settling time.

It is another object of the invention to provide a chopper-stabilized operational amplifier having extremely low output ripple noise, very low offset voltage, fast output slewing rate, and fast output settling time.

Briefly described, and in accordance with one embodiment, the present invention provides an operational amplifier (1B) which amplifies an input signal (Vin) to produce an output signal (Vout), and includes a 3-stage amplifier (1C) including a first amplifier stage (2) receiving the input signal, a second amplifier stage (3) driven by the first amplifier stage (2), and a third amplifier stage (4) driven by the second amplifier stage to produce the output signal: A slew detection current (Idetect) is generated when the input signal (Vin) exceeds a certain magnitude, and is converted to a control signal (41) that operates a switch (MN0) to short-circuit output conductors of the first amplifier stage to prevent signal charge from building up on capacitances associated with the output of the first amplifier stage during slewing.

In one embodiment, the invention provides an operational amplifier (1E,1D) including a 3-stage amplifier (1A,1B, or 1C) having first (7A) and second (7B) input conductors conducting a differential input signal (Vin) and an output (25) conducting an output signal (Vout). The 3-stage amplifier (1A,1B, or 1C) includes a first amplifier stage (2) having an input coupled to the input signal (Vin), a second amplifier stage (3) having an input coupled to an output of the first amplifier stage (2), and a third amplifier stage (4) having an input coupled to an output of the second amplifier stage (3) and an output (25) conducting the output signal (Vout) of the 3-stage amplifier (1A,1B or 1C). A slew rate and settling time improvement circuit (40/40A) includes an input coupled to the input signal (Vin) and an output (41), and also includes first circuitry (MN1, 2) coupled to the input signal (Vin) for producing a slew detection current (Idetect) when the magnitude of the input signal (Vin) exceeds a predetermined level. The slew rate and settling time improvement circuit (40/40A) includes second circuitry (MP0,MP2,MP4,MN3,MP5,MN5) for converting the slew detection current (Idetect) to a control signal (41) on the output (41) of the slew rate and settling time improvement circuit (40/40A), and also includes a first switch (MN0) controlled by the control signal (41) coupled to prevent signal charge from building up on capacitances associated with the output of the first amplifier stage (2) during slewing of the operational amplifier (1B,1D).

In a described embodiment, the 3-stage amplifier includes a feed-forward amplifier stage (5) having an input coupled to the input signal (Vin) and an output coupled to the input of the third amplifier stage (4). The first (2), second (3) and third (3) amplifier stages and the feed-forward stage (5) are operational transconductance amplifiers.

In one embodiment, a input chopper circuit (9) couples the input signal (Vin) to the input of the first amplifier stage (3) and an output chopper circuit (10) is coupled between the output of the first amplifier stage (2) and the input of the second amplifier stage (3). A notch filter (15) couples an output of the output chopper circuit (10) to the input of the second amplifier stage (3).

In a described embodiment, the first circuitry (MN1,2) includes a first transistor (MN1) having a gate coupled to the first input conductor (7A) and a source coupled to the second input conductor (7B) and a second transistor (MN2)) having a gate coupled to the second input conductor (7B) and a source coupled to the first input conductor (7A), drains of the first (MN1) and second (MN2) transistors being coupled to a first conductor (30) to cause the slew detection current (Idetect) to flow in the first conductor (30) if the magnitude of the input signal (Vin) exceeds the predetermined level. A current mirror (MP0, MP2) has an input (30) connected to receive the slew detection current (Idetect) and an output (31) coupled to a resistor (R) and an input of a first inverter (MP4,MN3) which produces a signal (32) representative of the slew current detection current (Idetect). The first inverter has an output (32) coupled to an input of a second inverter (MP5,MN5), an output of the second inverter (MP5,MN5) conducting the control signal (41).

In one embodiment, a second switch (MN4) is also controlled by the control signal (41). The first switch (MN0) prevents signal charge from building up on integrate and transfer capacitors (C5,C6 (FIG. 3)) associated with an input of the notch filter (15) during slewing of the operational amplifier (1D), and the second switch (MN4) prevents signal charge from building up on an additional capacitor (C4) associated with an output of the notch filter (15) during slewing of the operational amplifier (1D).

In one embodiment, the invention provides a method of amplifying an input signal (Vin) to produce an output signal (Vout), including providing a 3-stage amplifier (1A, 1B, or 1C) having first (7A) and second (7B) input conductors conducting a differential input signal (Vin) and an output (25) conducting the output signal (Vout), the 3-stage amplifier including a first amplifier stage (2) having an input coupled to the input signal (Vin), a second amplifier stage (3) having an input coupled to an output of the first amplifier stage (2), and a third amplifier stage (4) having an input coupled to an output of the second amplifier stage (3) and an output conducting the output signal (Vout). A slew detection current (Idetect) is produced when the magnitude of the input signal (Vin) exceeds a predetermined level. The method includes converting the slew detection current (Idetect) to a control signal (41) and short-circuiting conductors used in coupling the output of the first amplifier stage (2) to the input of the second amplifier stage (3) by means of a switch (MN0) controlled by the control signal (41) to prevent signal charge from building up on capacitances associated with the output of the first amplifier stage (2) during slewing of the 3-stage amplifier (1A,1B or 1C). In one embodiment, the method includes providing a feed-forward amplifier stage (5) having an input coupled to the input signal (Vin) and an output coupled to the input of the third amplifier stage (4) and coupling the input signal (Vin) to the input of the first amplifier stage (2) by means of an input chopper circuit (9) and coupling the output of the first amplifier stage (2) to the input of the second amplifier stage (3) by means of an output chopper circuit (10).

In one embodiment, the method includes coupling an output of the output chopper circuit (10) to the input of the second amplifier stage (3) by means of a notch filter (15). In the described embodiment, the method includes coupling a gate of a first transistor (MN1) to a first input conductor (7A) of the 3-stage amplifier, coupling a source of the first transistor (MN1) to a second input conductor (7B) of the 3-stage amplifier, coupling a gate of a second transistor (MN2) to the second input conductor (7B) of the 3-stage amplifier, coupling a source of the second transistor (MN2) to the first input conductor (7A) of the 3-stage amplifier the first circuitry (MN1,2), and coupling drains of the first and second transistors together to cause the slew detection current (Idetect) to flow in a conductor (30) coupled to the drains of the first and second transistors.

In one embodiment, the invention provides an operational amplifier for amplifying an input signal (Vin) to produce an output signal (Vout), including a 3-stage amplifier (1A,1B, or 1C) having first (7A) and second (7B) input conductors conducting a differential input signal (Vin) and an output (25) conducting the output signal (Vout). The 3-stage amplifier includes a first amplifier stage (2) having an input coupled to the input signal (Vin), a second amplifier stage (3) having an input coupled to an output of the first amplifier stage (2), and a third amplifier stage (4) having an input coupled to an output of the second amplifier stage (3) and an output conducting the output signal (Vout). The operational amplifier includes means (MN1,MN2,30) for producing a slew detection current (Idetect) when the magnitude of the input signal (Vin) exceeds a predetermined level, means (MP0,MP2,R) for converting the slew detection current (Idetect) to a control signal (41), and means (MN0) for short-circuiting conductors used in coupling the output of the first amplifier stage (2) to the input of the second amplifier stage (3) by means of a switch (MN0) controlled by the control signal (41) to prevent signal charge from building up on capacitances associated with the output of the first amplifier stage (2) during slewing of the 3-stage amplifier (1A,1B or 1C).

DETAILED DESCRIPTION OF THE PREFERRED EMBODIMENTS

Figure 3:
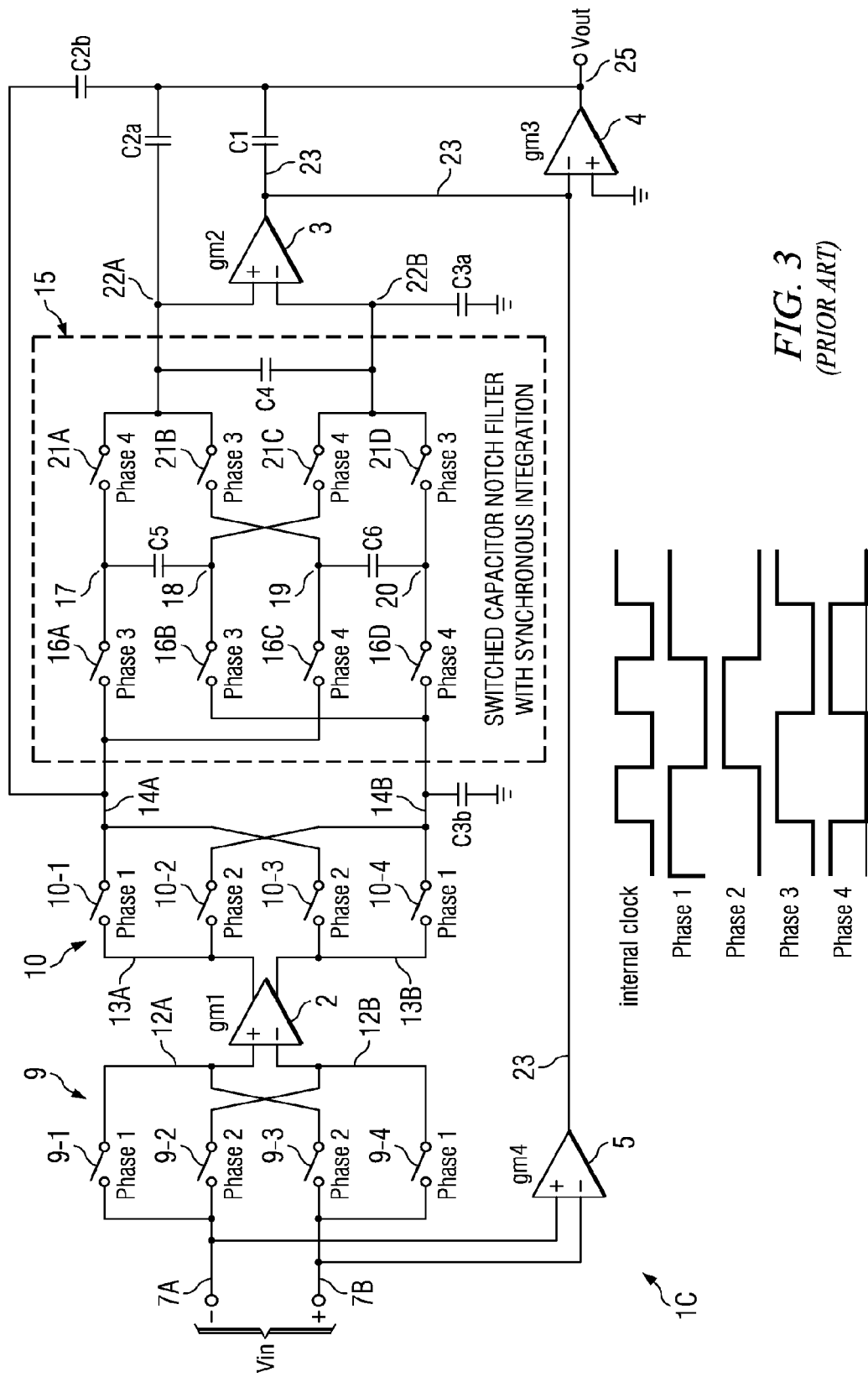
FIG. 3 is a detailed block diagram and timing diagram for a prior art chopper-stabilized 3-stage operational amplifier including a switched capacitor notch filter with synchronous integration.
Figure 4:
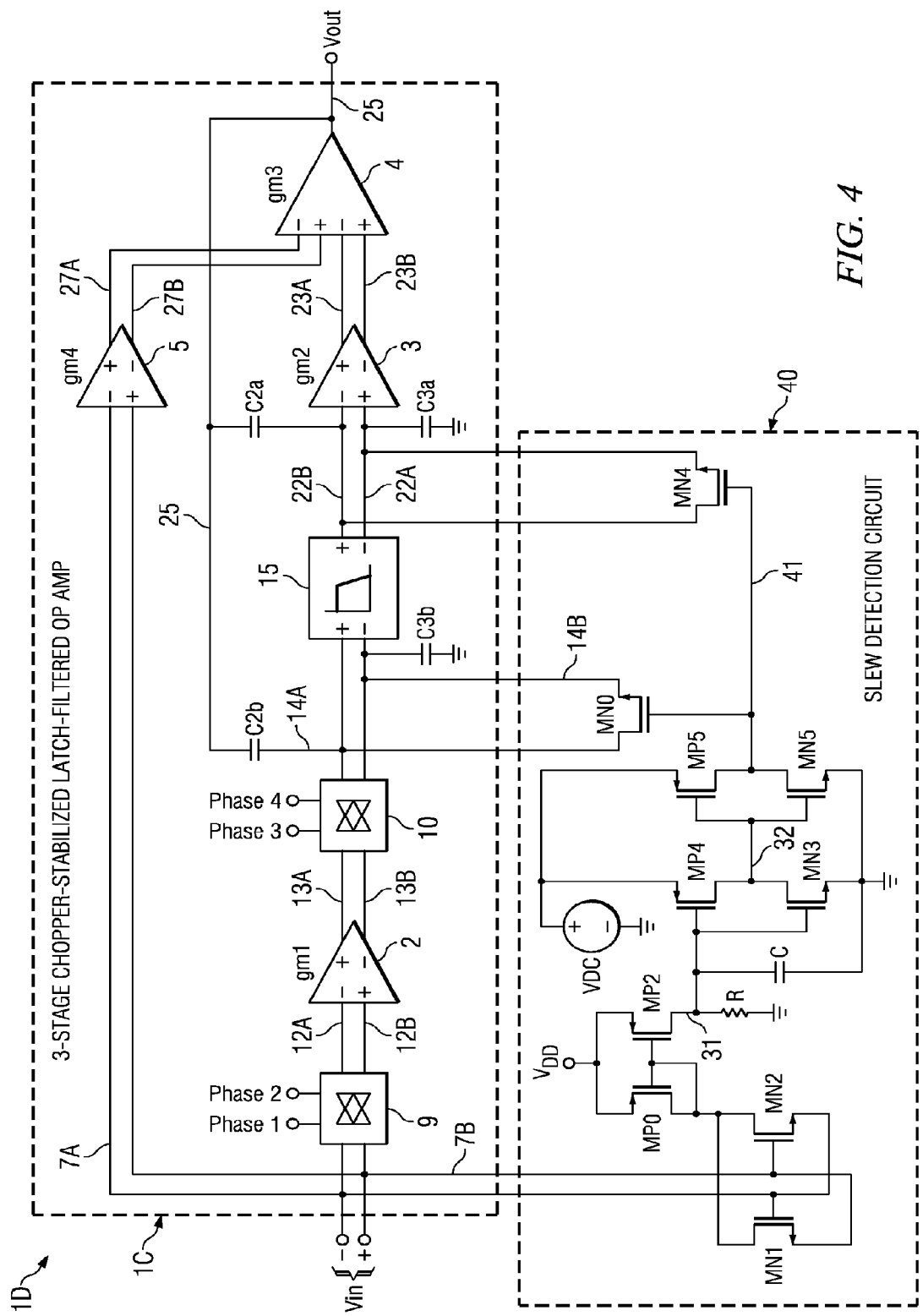
FIG. 4 is a detailed schematic diagram of the 3-stage chopper-stabilized amplifier of FIG. 3 further including slew rate and settling time improvement circuitry in accordance with the present invention.

Referring to FIG. 4, operational amplifier 1D includes a three-stage chopper-stabilized, notch-filtered operational amplifier 1C that can be identical to operational amplifier 1C of Prior Art FIG. 3. In accordance with the present invention, operational amplifier numeral 1D also includes a "slew rate and settling time improvement circuit" 40.

First, a detailed explanation of prior art operational amplifier 1C as shown in FIG. 3 and its slow slew settling problems is set forth because this information will be helpful in understanding the operation and benefits of slew rate and settling time improvement circuit 40.

Operational amplifier 1C includes (−) input conductor 7A and (+) input conductor 7B by means of which input signal Vin is applied to input chopping circuitry 9 (also referred to as "chopper 9"). Chopping circuitry 9 includes switches 9-1 and 9-2 connected to (−) input conductor 7A and switches 9-3 and 9-4 connected to (+) input conductor 7B. As shown in Prior Art FIG. 3, switches 9-1 and 9-3 are connected by conductor 12A to the (+) input of operational transconductance amplifier 2, and switches 9-2 and 9-4 are connected by conductor 12B to the (−) input of operational transconductance amplifier 2. Output conductors 13A and 13B of operational transconductance amplifier 2 are connected to output chopping circuitry 10, which includes switches 10-1 and 10-2 connected to conductor 13A and switches 10-3 and 10-4 connected to conductor 13B. Chopper switches 10-1 and 10-3 are connected to conductor 14A, and chopper switches 10-2 and 10-4 are connected to conductor 14B. The chopped output of operational transconductance amplifier 2 produced between conductors 14A and 14B is applied to the differential inputs of a switched capacitor notch filter 15. Conductor 14B is also connected to one terminal of a compensation capacitor C3b, the other terminal of which is connected to ground. Conductor 14A also is connected to one terminal of a compensation capacitor C2b, the other terminal of which is connected to Vout conductor 25. The output of notch filter 15 is connected to the input of operational transconductance amplifier 3.

Switched capacitor notch filter 15 (which is a low pass filter with notches at the chopping frequency fs and its harmonics) includes switch 16A connected between conductors 14A and 17, switch 16B connected between conductors 14B and 18, switch 16C connected between conductors 14A and 19, and switch 16D connected between conductors 14B and 20. An "integrate and transfer" capacitor C5 is connected between conductors 17 and 18, and another "integrate and transfer" capacitor C6 is connected between conductors 19 and 20. Switched capacitor notch filter 15 also includes switch 21A connected between conductors 17 and 22A, switch 21B connected between conductors 19 and 22A, switch 21C connected between conductors 18 and 22B, and switch 21D connected between conductors 20 and 22B. Capacitor C4 (FIG. 3) of notch filter 15 is connected between output conductors 22A and 22B of notch filter 15. The (+) input conductor 7B is connected to the (−) input of operational transconductance amplifier 5, the (+) input of which is connected to the (−) input conductor 7A of operational amplifier 1C.

Capacitor C2a provides feedback from Vout to the input of transconductance operational amplifier 3 and capacitor C4 and capacitor C2a perform a capacitive dividing function to determine how much of the Vout signal is getting fed back. Thus, capacitor C4, in addition to performing a charge redistribution function, also provides further low-pass filtering and contributes to local circuit stability.

The output of feed-forward operational transconductance amplifier 5, as shown in FIG. 4 rather than Prior Art FIG. 3, is connected by conductors 27A and 27B to a first (−) input and a first (+) input, respectively, of operational transconductance amplifier 4. Operational transconductance amplifier 4 alternatively can be an ordinary operational amplifier. (Capacitor C4 might be optional in some cases, but as indicated above it has been found to provide somewhat improved charge transfer, somewhat improved filtering and ripple noise reduction, and/or somewhat improved frequency compensation.) The transconductances of operational transconductance amplifiers 2 and 3, operational amplifier (or operational transconductance amplifier) 4, and operational transconductance amplifier 5 are gm1, gm2, gm3, and gm4, respectively.

Notch filter 15 thus includes two parallel signal paths, each with switches operating at the same frequency fs as the chopping signals Phase 1 and Phase 2 shown in Prior Art FIG. 3 but with a ¼ period delay. The ¼ period delays allow integrating of the amplified signal and the offset of input operational transconductance amplifier 2 in the half cycle of the chopping frequency. (The ¼ period of delay allows capacitors C5 and C6 to integrate the signal charge during half of Phase 1 and half of Phase 2, because when Phase 3 is high and Phase 1 is high, Phase 2 is low for ¼ of the period and then for the next quarter cycle Phase 1 is low and Phase 2 is high. For a DC signal, for example an offset voltage component due to switching, the offset voltage component does not change polarity because integration is in the positive direction during a quarter of a cycle and in the negative direction during the next quarter of a cycle. Therefore the ripple errors are canceled.) However, it should be noted that the switching frequency of notch filter 15 can be different than the chopping frequency fs. For example, the switching frequency of notch filter 15 can be one half of the chopping frequency fs, with no delay, in which case the amplified signal and the offset and ripple components therein are integrated over an entire chopping frequency cycle.

The (+) and (−) inputs of notch filter 15 are connected to conductors 14A and 14B, respectively. Notch filter output conductor 22A is connected to the (+) input of operational transconductance amplifier 3 and to one terminal of compensation capacitor C3a, the other terminal of which is connected to ground. Notch filter output conductor 22B is connected to the (−) input of operational transconductance amplifier 3 and to one terminal of compensation capacitor C2a, the other terminal of which is connected to Vout conductor 25. The (+) and (−) outputs of operational transconductance amplifier 3 are connected by conductors 23A and 23B to a second (−) input and a second (+) input, respectively, of operational transconductance amplifier or operational amplifier 4 (hereinafter referred to simply as operational amplifier 4), the output of which is connected to Vout conductor 25.

Note that in Prior Art FIG. 3 the outputs of operational transconductance amplifiers 3 and 5 are, for simplicity, illustrated as being single-ended outputs, whereas in FIG. 4 they are shown as differential outputs which typically would be used. The "front end" circuitry of transconductance amplifier gm3 preferably includes a conventional differential folded-cascode stage. The differential output of feed-forward operational transconductance amplifier 5 typically is produced by a pair of PMOS transistors and is coupled to a pair of resistors in a lower voltage section of the folded-cascode stage. The differential output signal of operational transconductance amplifier 3 typically is produced between conductors 23A and 23B which are connected, respectively, to each resistor of a pair of resistors in a higher voltage section of the folded-cascode stage of operational transconductance amplifier and 4.

The timing diagram shown along with operational amplifier 1C in Prior Art FIG. 3 illustrates four synchronized clock signals Phase1, Phase2, Phase3, and Phase4 which can be used to control the various chopping switches and filter switches in chopper circuits 9 and 10 and notch filter 15 in both FIGS. 3 and 4. Phase1 controls chopping switches 9-1, 9-4, 10-1, and 10-4, and Phase2 controls chopping switches 9-2, 9-3, 10-2, and 10-3. Phase3 controls notch filter switches 16A, 16B, 21B, and 21D, and Phase4 controls switches 16C, 16D, 21A and 21C. The Phase3 and Phase4 notch filter clocking signals operate at the same frequency fs as the chopping signals Phase1 and Phase2 but are 90 degrees out of phase with them. Alternatively, the Phase3 and Phase4 notch filter clocking signals could operate at half the chopping frequency, i.e. at fs/2, as the chopping signals Phase 1 and Phase2 but in phase with them.

Operational amplifier 1D has two signal paths, including a three-stage high gain signal path through operational transconductance amplifiers 2, 3 and 4 and a two-stage wideband width signal path through operational transconductance amplifiers 5 and 4.

Input conductors 14A and 14B of notch filter 15 conduct output currents from transconductance stage 2, and the net current through conductors 14A and 14B is integrated during one of Phase1 and Phase2 onto integrate and transfer capacitor C5, and during the other phase the net current is integrated onto the other integrate and transfer capacitor C6. This results in all of the signal charge being available on integrate and transfer capacitors C5 and C6, and all of the signal charge is available for redistribution to the next stage, i.e. to the capacitance coupled to notch filter output conductors 22A and 22B. This is advantageous because any loss of signal charge may result in loss of signal information and cause signal distortion.

For example, the net input current into notch filter input conductors 14A and 14B is integrated onto integrate and transfer capacitor C5 during Phase1, and then during Phase2 the net notch filter input current is integrated onto integrate and transfer capacitor C6 while the charge on integrate and transfer capacitor C5 is simultaneously redistributed onto capacitance (including capacitor C4) coupled to notch filter output conductors 22A and 22B. With integrate and transfer capacitor C5 coupled to capacitor C4, a redistribution (rather than a complete voltage transfer) of the integrated signal charge is achieved, and over multiple cycles the capacitance (including capacitor C4) coupled to notch filter output conductors 22A and 22B is charged to the correct signal voltage.

In the operation of notch filter 15, one signal path integrates the amplified and chopped signal (including the ripple current resulting from the offset voltage) from operational transconductance amplifier 2 on the integrate and transfer capacitor C5 during one half of the notch filter switching cycle. During the same interval the other signal path "transfers" the amplified signal (including the ripple current resulting from the offset voltage) from integrate and transfer capacitor C6 to operational transconductance amplifier 3. During the next half cycle of operation of notch filter 15, the integrate and transfer functions of the two signal paths are reversed. The frequency response of notch filter 15 includes notches at the chopping frequency spectrum values of fs and its harmonics, so the notches suppress the ripple voltages that usually occur in a conventional chopper-stabilized amplifier.

As previously indicated, chopper-stabilized amplifier 1C of Prior Art FIG. 3 has the problem that the averaging function of notch filter 15 treats a large, fast changing signal as an error signal and averages it, and this requires a number of clock cycles for the amplifier output 1C to reach its final value and thus increases its output settling time during a large signal slewing operation. During the first half of a cycle switches 16A and 16B are on, i.e., closed, and then the signal charge corresponding to the value of Vin, is charged into integrate and transfer capacitor C5. Then during the next half cycle, switches 16A and 16B are off and the charge on capacitor C5 is transferred to C4 because switches 21A and 21C are closed. In the meantime, switches 16C and 16D are closed, so during the second half cycle, the signal charge is charged into integrate and transfer capacitor C6.

During slewing, Vin changes very fast, so during the first half cycle and the second half cycle the values of Vin and hence the corresponding signal input to notch filter 15 charge will be very different in the first and second half-cycles. Therefore the voltage to which C5 is charged is much different than the voltage to which C6 is charged. So during one cycle an amount of charge is transferred from capacitor C5 to capacitor C4 and during the next cycle a substantially different amount of signal charge is transferred from C6 to C4. Therefore there will be substantially different signal charge redistribution between C5 and C4 and between C6 and C4. Since the amount of signal charge changes rapidly and substantially during slewing, several additional cycles are required for the signal charge difference to be redistributed or rebalanced between capacitors C5 and C4 and between capacitors C6 and C4 before Vout is able to achieve a steady value.

Slew improvement circuitry 40 is provided in operational amplifier 1D of FIG. 4 to solve the foregoing slewing and settling problem by first detecting when operational amplifier 1D goes into slewing operation and, in response, short-circuiting capacitors C5, C6, and C4 in notch filter 15 to prevent charge from being held on them during slewing operation.

In FIG. 4, slew rate and settling time improvement circuitry 40 includes N-channel slew-detecting transistor MN1 having its gate connected to input conductor 7A and its source connected to input conductor 7B. Similarly, N-channel slew-detecting transistor MN2 has its gate connected to input conductor 7B and its source connected to input conductor 7A. The drains of slew-detecting transistors MN1 and MN2 are connected to the drain and gate of a P-channel current mirror input transistor MP0 and the gate of a P-channel current mirror output transistor MP2. The sources of current mirror transistors MP0 and MP2 are connected to VDD. The drain of current mirror output transistor MP2 is connected by conductor 31 to one terminal of a resistor R, one terminal of capacitor C, and to the gates of a P-channel transistor MP4 and a N-channel transistor MN3, the drains of which are connected together by conductor 32 and to the gates of a P-channel transistor MP5 and a N-channel transistor MN5. The other terminal of resistor R, the other terminal of capacitor C, and the sources of transistors MN3 and MN5 are connected to ground.

Transistors MP4 and MN3 form a CMOS inverter, and transistors MP5 and MN5 form another CMOS inverter. The sources of transistors MP4 and MP5 are connected to a suitable reference voltage VDC, which for example can be VDD. The drains of transistors MP5 and MN5 are connected by conductor 41 to the gates of N-channel switch transistors MN0 and MN4. The source of switch transistor MN0 is connected by conductor 14B to the (−) input of notch filter 15 and the drain of switch transistor MN0 is connected by conductor 14A to the (+) input of notch filter 15. Similarly, the source of switch transistor MN4 is connected by conductor 22A to the (+) input of notch filter 15 and the drain of switch transistor MN4 is connected by conductor 22B to the (−) input of notch filter 15.

During slewing there will be a large voltage difference between conductors 7A and 7B. When the magnitude of Vin is sufficiently large, i.e. greater than the threshold voltage of transistors MN1 and MN2, one or the other of slew-detecting transistors MN1 and MN2 turns on, depending on the polarity of Vin, and the other slew-detecting transistor remains off. If either of slew-detecting transistors MN1 and MN2 is turned on, that indicates the beginning of a slewing operation, and a current Idetect flows through current mirror input transistor MP0 and therefore is mirrored through the current mirror output transistor MP2 into resistor R. This increases the voltage on resistor R, i.e., the voltage on conductor 31, and turns off MP4 and turns on transistor MN3. Capacitor C performs the function of slowing down the discharge of the voltage which occurs on conductor 31 when both of transistors MN1 and MN2 are off. The inverter formed by transistors MP4 and MN3 inverts the voltage signal on conductor 31. The resulting inverted signal on conductor 32 is inverted again by the inverter formed by transistors MP5 and MN5 to produce a control signal on conductor 41 that turns on N-channel switch transistor MN0, which then short-circuits conductors 14A and 14B. This prevents signal charge from accumulating in integrate and transfer capacitors C5 and C6 during slewing. The control signal on conductor 41 also turns on a N-channel switch transistor MN4, which short-circuits conductors 22A and 22B.

Thus, inside notch filter 15, the turning on of switch transistors MN0 and MN4 during slewing eliminates any charge on both of integrate and transfer capacitors C5 and C6. This does not cause any problems because no charge is needed on either of capacitors C5 and C6 during slewing.

Since switch MN0 short-circuits conductors 14A and 14B together during the slewing, transconductance operational amplifier 2 does not need to supply any differential charge to the capacitances coupled to conductors 14A and 14B. That causes the slew rate or rise time to be somewhat faster. More important, since transconductance operational amplifier 2 does not have to supply differential charges to the capacitances on conductors 14A and 14B after it comes out of stewing operation, conductors 14A and 14B are still at their common mode voltages and therefore do not need to settle from a differential voltage between them. (This is especially true since during stewing there is a large magnitude of the Vin signal that would otherwise cause transconductance amplifier 2 to attempt to generate a large voltage difference between conductors 14A and 14B and accordingly charge up the separate capacitive loads on those two conductors.) The closing of switch MN0 during slewing therefore substantially reduces the settling time of Vout after slewing. Furthermore, the simultaneous closing of switch MN4 during slewing (so as to prevent charge from building up on integrate and transfer capacitors C5 and C6 during the slewing) results in a substantial reduction of the settling time of Vout immediately after slewing. Similarly, switch MN4 keeps conductors 22A and 22B at their common mode voltage during slewing.

Since there is no charge on either of capacitors C5 and C6 when the operational amplifier 1D is finished slewing, no time needs to be allowed for the voltage on either of capacitors C5 and C6 to settle. The same is true for capacitor C4. Therefore no time needs to be allowed for Vout to settle. During normal operation with no slewing and conductor 41 is at a low voltage and switch transistors MN0 and MN4 are off, and slew improvement circuit 40 does not affect normal operation of chopper-stabilized notch-filtered operational amplifier 1C.

The capacitance of capacitor C in slew rate and settling time improvement circuit 40 is chosen to provide a suitable delay between the time at which current mirror output transistor MP2 turns off at the end of a slewing value of Vin and the time at which switch transistors MN0 and MN4 are turned off by the voltage on conductor 41. Specifically, capacitor C and resistor R determine how long it takes for the voltage on conductor 31 to discharge. That amount of time determines how much longer switch transistors MN0 and MN4 remain turned on after the magnitude of Vin falls below the value required to initiate slewing.

Thus, as soon as operational amplifier 1D begins slewing operation, switch transistors MN0 and MN4 effectively short-circuit the capacitors C5, C6 and C4 inside notch filter 15 so that no error signal will build up charge on capacitors C5 and C6. Since there is no charge built up on the capacitors when operational amplifier 1C of FIG. 4 comes out of slewing operation, no time is required for the voltage between conductors 23A and 23B to settle, and therefore no time is required for Vout to settle either.

Figure 1:
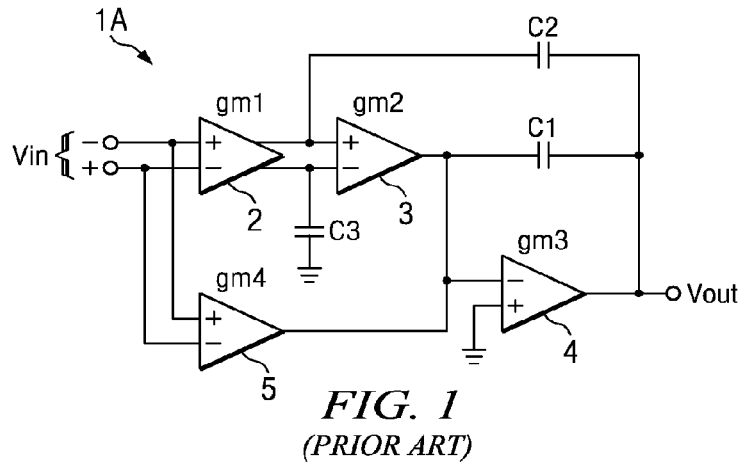
FIG. 1 is block diagram of a prior art 3-stage operational amplifier with multi-path nested Miller compensation.
Figure 5:
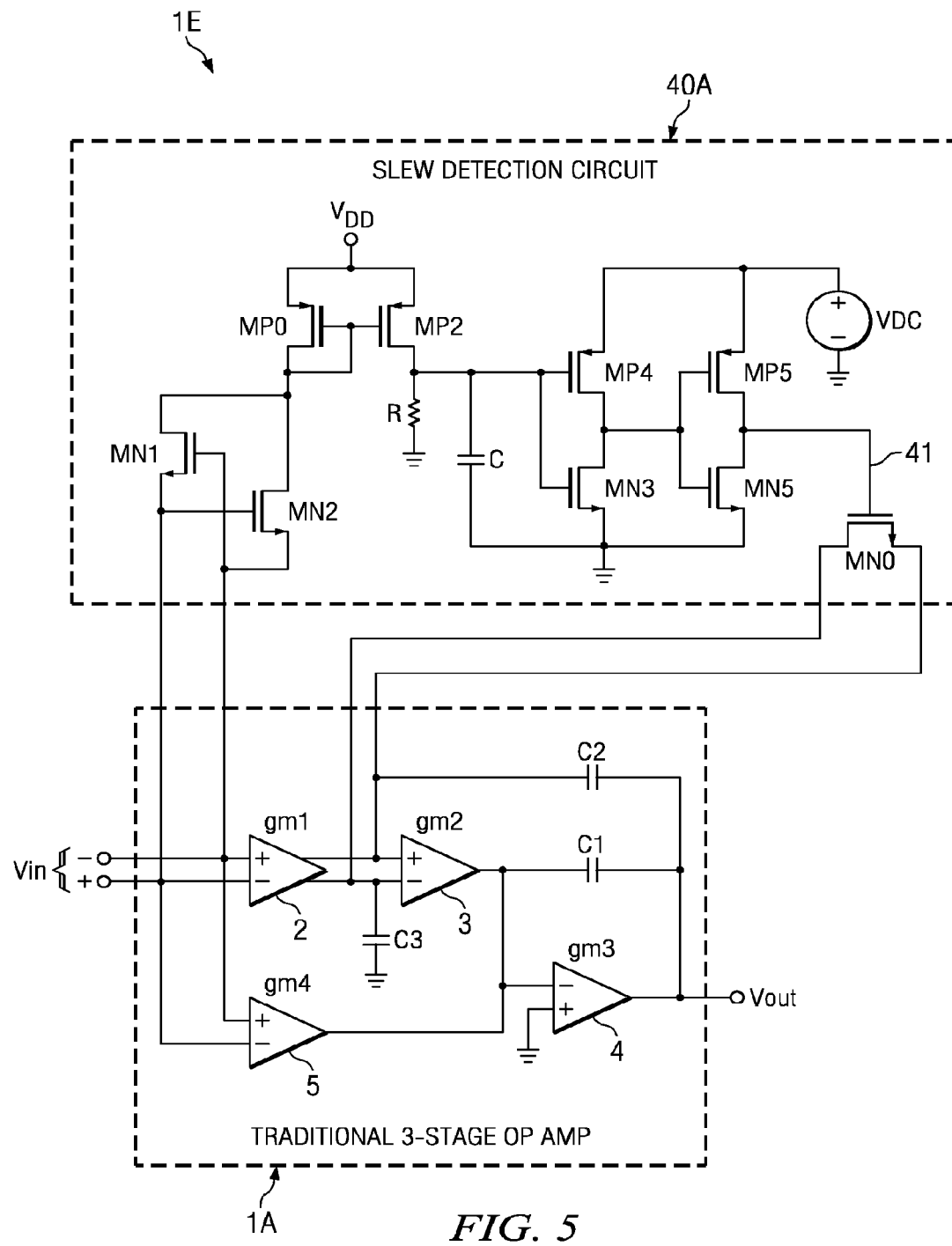
FIG. 5 is a detailed schematic diagram of a 3-stage amplifier without chopper stabilization or notch filtering including slew rate and settling time improvement circuitry of the present invention.

Referring to FIG. 5, operational amplifier 1E includes traditional 3-stage amplifier 1A of Prior Art FIG. 1 further including slew rate improvement circuitry 40A, which is the same as the slew rate improvement circuitry shown in FIG. 4 except that only a single switch transistor MN0 is included. The source and drain of switch transistor MN0 is connected to the (+) and (−) inputs, respectively, of operational transconductance amplifier 3. Switch transistor MN0 is turned on during slewing operation of operational amplifier 1E. This prevents compensation capacitors C2 and C3 from being charged up during slewing, and therefore no additional time needs to be provided after the end of slewing in order to allow settling of the voltage difference between the (+) and (−) inputs of operational transconductance amplifier 3. Consequently, no additional time needs to be allowed for corresponding settling of Vout, either. (Slew rate and settling time improvement circuit 40A would be connected to prior art chopper-stabilized operational amplifier 1B of FIG. 2 in exactly the same manner shown in FIG. 5.)

Figure 6:
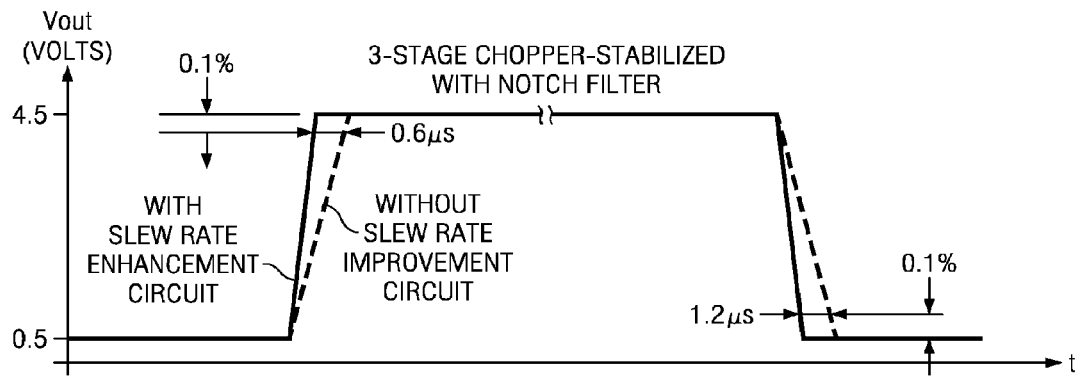
FIGS. 6-8 are diagrams of 3-stage amplifier output waveforms that are useful in explaining the amount of the slew rate and settling time improvement and settling time improvement resulting from use of the present invention.
Figure 7:
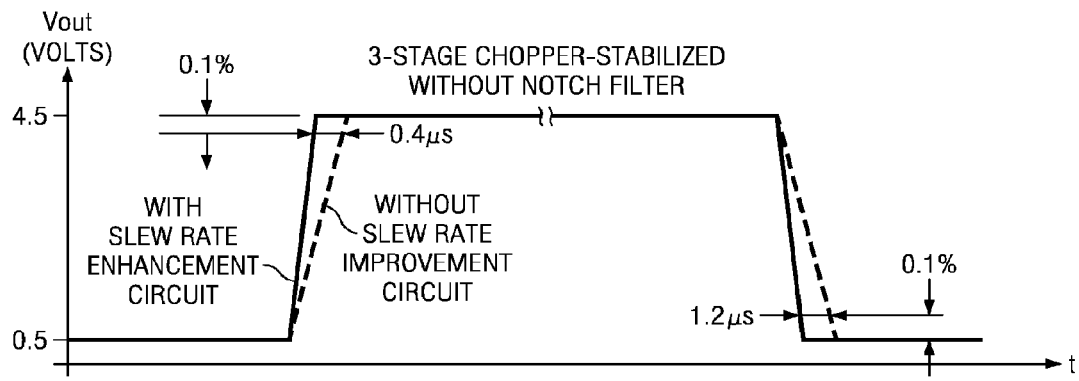
Figure 8:
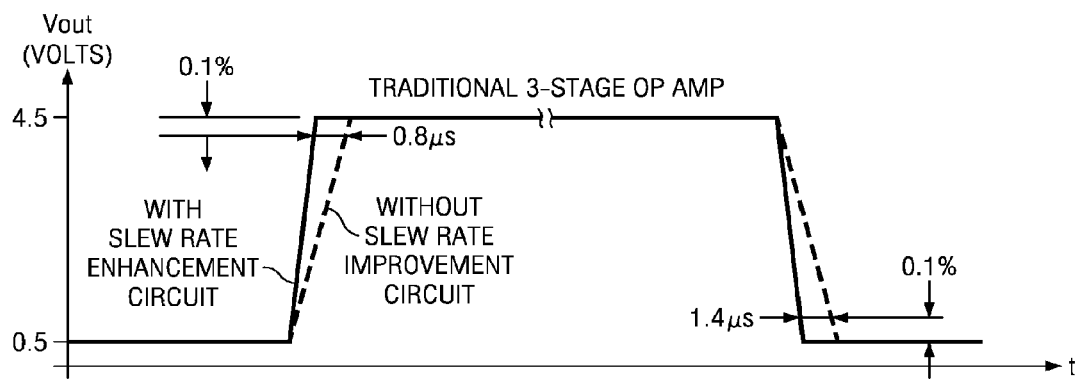

FIGS. 6, 7 and 8 show representations of the simulated performance of three different operational amplifiers including the slew detection in the slew rate and settling time improvement circuitry of the present invention.

The waveform of FIG. 6 shows the results for a particular implementation of three-stage chopper-stabilized notch-filtered operational amplifier 1D of FIG. 4. In this case, the Vout waveform in FIG. 6 shows that for the rising edge of Vout from a low level of 0.5 volts to within 0.1% of a high level of 4.5 volts, the rise time is 0.6 microseconds less than if the slew rate and settling time improvement circuitry 40 is omitted. (The same computer simulation showed an improvement of 0.9 microseconds in the rise time to within 0.01% of the 4.5 volt level and 0.2 microseconds in the rise time to within 0.001% of the 4.5 volt level.) The Vout waveform in FIG. 6 also shows that for the falling edge of Vout from a low level of 4.5 volts to within 0.1% of a high level of 0.5 volts, the fall time is 1.2 microseconds less than if the slew rate and settling time improvement circuitry 40 is omitted. (The same computer simulation showed an improvement of 1.2 microseconds in the fall time to within 0.01% of the 4.5 volt level and 0.6 microseconds in the fall time to within 0.001% of the 4.5 volt level.). Note that the time required for Vout to settle to within, e.g., 0.1% of the final high value or low value at the end of a rising edge or falling edge of Vout, respectively, may include a few cycles of ringing.

Figure 2:
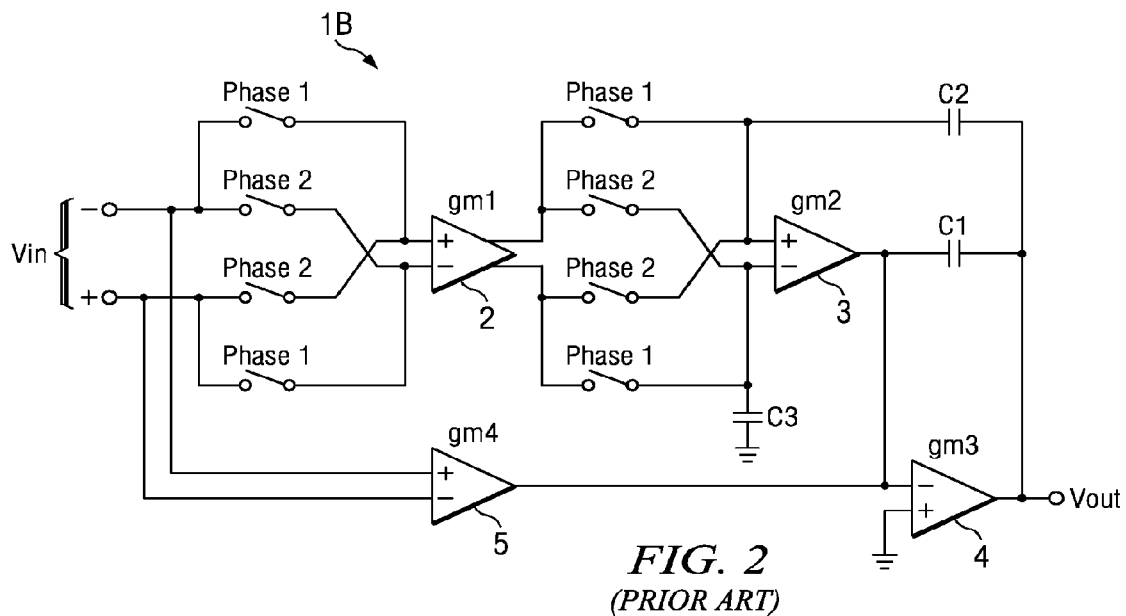
FIG. 2 is a block diagram of a prior art 3-stage chopper-stabilized operational amplifier.

Similarly, the waveform of FIG. 7 shows the results for a particular implementation of conventional three-stage chopper-stabilized notch-filtered operational amplifier 1B (with no notch filtering) of Prior Art FIG. 2 with and without the slew rate and settling time improvement circuitry 40. In this case, the Vout waveform in FIG. 7 shows that for the rising edge of Vout from a low level of 0.5 volts to within 0.1% of a high level of 4.5 volts, the rise time is 0.4 microseconds less than if the slew rate and settling time improvement circuitry 40 is omitted. (The same computer simulation showed an improvement of 0.4 microseconds in the rise time to within 0.01% of the 4.5 volt level and an increase of 0.8 microseconds in the rise time to within 0.001% of the 4.5 volt level.) The Vout waveform in FIG. 7 also shows that for the falling edge of Vout from a high level of 4.5 volts to within 0.1% of a low level of 0.5 volts, the fall time is 1.2 microseconds less than if the slew rate and settling time improvement circuitry 40 is omitted. (The same computer simulation showed an improvement of 1.0 microseconds in the fall time to within 0.01% of the 4.5 volt level and 0.7 microseconds in the fall time to within 0.001% of the 4.5 volt level.).

The waveform of FIG. 8 shows the simulation results (but with the slew rate and settling time improvement circuitry 40 is still optimized for use with a chopper-stabilized, notch-filtered amplifier) for a particular implementation of the traditional three-stage operational amplifier 1A (no chopper stabilization or notch filtering) of Prior Art FIG. 1. In this case, the Vout waveform in FIG. 8 shows that for the rising edge of Vout from a low level of 0.5 volts to within 0.1% of a high level of 4.5 volts, the rise time is 0.8 microseconds less than if the slew rate and settling time improvement circuitry 40 is omitted. (The same computer simulation showed an improvement of 1.2 microseconds in the rise time to within 0.01% of the 4.5 volt level and 0.4 microseconds in the rise time to within 0.001% of the 4.5 volt level.) The Vout waveform in FIG. 8 also shows that for the falling edge of Vout from a high level of 4.5 volts to within 0.1% of a low level of 0.5 volts, the fall time is 1.4 microseconds less than if the slew rate and settling time improvement circuitry 40 is omitted. (The same computer simulation showed an improvement of 1.2 microseconds in the fall time to within 0.01% of the 4.5 volt level and 0.1 microseconds in the fall time to within 0.001% of the 4.5 volt level.) Note that foregoing rise times and fall times of Vout on were obtained for simulations of the slew rate and settling time improvement circuitry 40 which was optimized for 3-stage chopper-stabilized notch-filtered operational amplifier 1D of FIG. 4. It should be appreciated that the same slew rate and settling time improvement circuitry 40 can be used with some optimization to achieve the best rise and fall times for various other 3-stage amplifiers without chopping, notch filtering, and/or different inherent slew rates.

The above described embodiments of the invention provide various three-stage amplifiers with slew rate and settling time improvement circuitry without creating substantial difficulties in design and implementation. Specifically, the present invention allows such a three stage chopper stabilized amplifier to settle faster to its final value after slewing without increasing chopping frequency. Further more, it also improves settling time of a traditional 3-stage amplifier even without chopping technique being used.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the invention is applicable to multi-stage operational amplifiers having more than 3 stages (not counting feed-forward stages).

What is claimed is:

1. An operational amplifier comprising:
   a 3-stage amplifier having first and second input conductors conducting a differential input signal and an output conducting an output signal, wherein the 3-stage amplifier includes:
      a first amplifier stage having an input coupled to the input signal;
      a second amplifier stage having an input coupled to an output of the first amplifier stage;
      a third amplifier stage having an input coupled to an output of the second amplifier stage and an output conducting the output signal of the 3-stage amplifier; and
   a feed-forward amplifier stage having an input coupled to the input signal and an output coupled to the input of the third amplifier stage; and
   a slew rate and settling time improvement circuit having an input coupled to the input signal and an output, the slew rate and settling time improvement circuit including:
      first circuitry coupled to the input signal for producing a slew detection current when the magnitude of the input signal exceeds a predetermined level;
      second circuitry for converting the slew detection current to a control signal on the output of the slew rate and settling time improvement circuit; and first switch controlled by the control signal coupled to prevent signal charge from building up on capacitances associated with the output of the first amplifier stage during slewing of the operational amplifier.

2. The operational amplifier of claim 1 wherein the first amplifier stage and the second amplifier stage are operational transconductance amplifiers.

3. The operational amplifier of claim 1 wherein the first, second, and third amplifier stages and the feed-forward stage are operational transconductance amplifiers.

4. The operational amplifier of claim 2 wherein the third amplifier stage is an operational transconductance amplifier.

5. An operational amplifier comprising:
a 3-stage amplifier having first and second input conductors conducting a differential input signal and an output conducting an output signal. wherein the 3-stage amplifier includes:
  a first amplifier stage having an input coupled to the input signal;
  a second amplifier stage having an input coupled to an output of the first amplifier stage;
  a third amplifier stage having an input coupled to an output of the second amplifier stage and an output conducting the output signal of the 3-stage amplifier; and
  an input chopper circuit coupling the input signal to the input of the first amplifier stage and an output chopper circuit coupled between the output of the first amplifier stage and the input of the second amplifier stage; and
a slew rate and settling time improvement circuit having an input coupled to the input signal and an output, the slew rate and settling time improvement circuit including:
  first circuitry coupled to the input signal for producing a slew detection current when the magnitude of the input signal exceeds a predetermined level;
  second circuitry for converting the slew detection current to a control signal on the output of the slew rate and settling time improvement circuit; and
  a first switch controlled by the control signal coupled to prevent signal charge from building up on capacitances associated with the output of the first amplifier stage during slewing of the operational amplifier.

6. The operational amplifier of claim 5 including a notch filter coupling an output of the output chopper circuit to the input of the second amplifier stage.

7. An operational amplifier comprising:
a 3-stage amplifier having first and second input conductors conducting a differential input signal and an output conducting an output signal, wherein the 3-stage amplifier includes:
  a first amplifier stage having an input coupled to the input signal;
  a second amplifier stage having an input coupled to an output of the first amplifier stage; and
  a third amplifier stage having an input coupled to an output of the second amplifier stage and an output conducting the output signal of the 3-stage amplifier; and
a slew rate and settling time improvement circuit having an input coupled to the input signal and an output, the slew rate and settling time improvement circuit including:
  first circuitry coupled to the input signal for producing a slew detection current when the magnitude of the input signal exceeds a predetermined level, wherein the first circuit includes a first transistor having a gate coupled to the first input conductor and a source coupled to the second input conductor and a second transistor having a gate coupled to the second input conductor and a source coupled to the first input conductor, drains of the first and second transistors being coupled to a first conductor to cause the slew detection current to flow in the first conductor if the magnitude of the input signal exceeds the predetermined level;
  second circuitry for converting the slew detection current to a control signal on the output of the slew rate and settling time improvement circuit; and
  a first switch controlled by the control signal coupled to prevent signal charge from building up on capacitances associated with the output of the first amplifier stage during slewing of the operational amplifier.

8. The operational amplifier of claim 7 wherein the first and second transistors are N-channel transistors.

9. The operational amplifier of claim 8 including a current mirror having an input connected to receive the slew detection current and an output coupled to a resistor and an input of a first inverter which produces a signal representative of the slew current detection current.

10. The operational amplifier of claim 9, the first inverter having an output coupled to an input of a second inverter, an output of the second inverter conducting the control signal.

11. The operational amplifier of claim 10 wherein the first and second inverters are CMOS inverters.

12. The operational amplifier of claim 6 including a second switch controlled by the control signal, the first switch preventing signal charge from building up on integrate and transfer capacitors associated with an input of the notch filter during slewing of the operational amplifier, the second switch preventing signal charge from building up on an additional capacitor associated with an output of the notch filter during slewing of the operational amplifier.

13. The operational amplifier of claim 12 wherein the first and second switches are composed of N-channel transistors having gate electrodes coupled to the control signal.

14. A method of amplifying an input signal to produce an output signal, comprising:
providing a 3-stage amplifier having first and second input conductors conducting a differential input signal and an output conducting the output signal, wherein the 3-stage amplifier including includes:
  a first amplifier stage having an input coupled to the input signal;
  a second amplifier stage having an input coupled to an output of the first amplifier stage;
  a third amplifier stage having an input coupled to an output of the second amplifier stage and an output conducting the output signal; and
a feed-forward amplifier stage having an input coupled to the input signal and an output coupled to the input of the third amplifier stage; and
producing a slew detection current when the magnitude of the input signal exceeds a predetermined level;
converting the slew detection current to a control signal; and
short-circuiting conductors used in coupling the output of the first amplifier stage to the input of the second amplifier stage by means of a switch controlled by the control signal to prevent signal charge from building up on capacitances associated with the output of the first amplifier stage during slewing of the 3-stage amplifier.

15. The method of claim 14 including coupling the input signal to the input of the first amplifier stage by means of an input chopper circuit and coupling the output of the first amplifier stage to the input of the second amplifier stage by means of an output chopper circuit.

16. The method of claim 15 including coupling an output of the output chopper circuit to the input of the second amplifier stage by means of a notch filter.

17. The method of claim 14 wherein step of producing a slew detection current when the magnitude of the input signal exceeds the predetermined level includes coupling a gate of a first transistor to a first input conductor of the 3-stage amplifier, coupling a source of the first transistor to a second input conductor of the 3-stage amplifier, coupling a gate of a second transistor to the second input conductor of the 3-stage amplifier, coupling a source of the second transistor to the first input conductor of the 3-stage amplifier the first circuitry, and coupling drains of the first and second transistors together to cause the slew detection current to flow in a conductor coupled to the drains of the first and second transistors.

18. An apparatus comprising:
   a multi-stage amplifier having a first input terminal and a second input terminal that receive a differential input signal, wherein the multi-stage amplifier includes:
      an first chopper that is coupled to the first input terminal and the second input terminal;
      a first amplifier that is coupled to the input chopper;
      a second chopper that is coupled to the first amplifier;
      a notch filter that is coupled to the second chopper;
      a second amplifier that is coupled to the notch filter;
      a third amplifier that is coupled to the first input terminal and the second input terminal; and
      a fourth amplifier that is coupled to the second amplifier and the third amplifier; and
   detection circuitry having:
      a first slew detecting transistor that is coupled to the first input terminal;
      a second slew detecting transistor that is coupled to the second input terminal;
      a current mirror that is coupled to each of the first and second slew detecting transistors;
      an inverter that is coupled to the current mirror;
      a first switch transistor that is coupled to the notch filter and the inverter, wherein the inverter controls the first switch; and
      a second switch transistor that is coupled the notch filter and the inverter, wherein the inverter controls the switch transistor.

19. The apparatus of claim 18, wherein the inverter further comprises a plurality of inverters coupled in series with one another.

20. The apparatus of claim 18, wherein the first slew detecting transistor further comprises a first NMOS transistor that is coupled to the first input terminal at its gate and source and that is coupled to the current mirror at its source, and wherein the second slew detecting transistor further comprises a second NMOS transistor that is coupled to the second input terminal at its gate and source and that is coupled to the current mirror at its source.

21. The apparatus of claim 20, wherein the detection circuitry further comprises:
   a resistor that is coupled to the current mirror and ground; and
   a capacitor that is coupled in parallel to the resistor.

22. The apparatus of claim 21, wherein the first switch transistor further comprises a third NMOS transistor that is coupled to the notch filter and the second copper at its drain and source and that is coupled to the inverter at its gate, and wherein the second switch transistor further comprises a fourth NMOS transistor that is coupled to the notch filter and the second amplifier at its drain and source and that is coupled to the inverter at its gate.

* * * * *